United States Patent
Kanno

(10) Patent No.: US 9,947,462 B2
(45) Date of Patent: Apr. 17, 2018

(54) WIRELESS POWER TRANSMISSION SYSTEM, POWER TRANSMITTING DEVICE, AND POWER RECEIVING DEVICE

(71) Applicant: Panasonic Intellectual Property Management Co., Ltd., Osaka (JP)

(72) Inventor: Hiroshi Kanno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/393,385

(22) Filed: Dec. 29, 2016

(65) Prior Publication Data

US 2017/0110242 A1    Apr. 20, 2017

Related U.S. Application Data

(63) Continuation of application No. 13/935,544, filed on Jul. 4, 2013, now Pat. No. 9,565,794.

(Continued)

(51) Int. Cl.
*H01F 27/26* (2006.01)
*H02J 50/12* (2016.01)
(Continued)

(52) U.S. Cl.
CPC .......... *H01F 27/365* (2013.01); *B60L 11/182* (2013.01); *H01F 27/02* (2013.01);
(Continued)

(58) Field of Classification Search
CPC ............ H02J 5/005; H02J 7/025; H02J 17/00; H02N 2/008; H04B 5/0025–5/0093;
(Continued)

(56) References Cited

U.S. PATENT DOCUMENTS 6,049,191 A    4/2000  Terazoe
6,963,305 B2  11/2005  Knapp
(Continued)

FOREIGN PATENT DOCUMENTS

DE    202011000613 U1    6/2012
JP    08-163792 A        6/1996
(Continued)

OTHER PUBLICATIONS

International Search Report for corresponding International Application No. PCT/JP2013/004133 dated Jul. 23, 2013.
(Continued)

*Primary Examiner* — Rexford Barnie
*Assistant Examiner* — Thai Tran
(74) *Attorney, Agent, or Firm* — Renner, Otto, Boisselle & Sklar, LLP

(57) ABSTRACT

This wireless power transmission system includes: a power transmitting antenna and a power receiving antenna arranged to face each other and not to be in contact with each other; and an electromagnetic shield structure that includes a first shield and a second shield to house, in its inner space, the power transmitting and power receiving antennas facing each other. The first and second shields are configured to make first and second spaces to house the power transmitting and power receiving antennas, respectively. At least one of the first and second shields includes a protruding portion that is parallel to at least one of the power transmitting and power receiving antennas and that protrudes out of the shield sidewalls. Power is transmitted by a non-contact method through a radio frequency magnetic field from the power transmitting antenna to the power receiving antenna.

9 Claims, 11 Drawing Sheets

Related U.S. Application Data

(60) Provisional application No. 61/668,198, filed on Jul. 5, 2012.

(51) Int. Cl.

| | | |
|---|---|---|
| *H02J 50/20* | (2016.01) | |
| *H01F 27/36* | (2006.01) | |
| *B60L 11/18* | (2006.01) | |
| *H02J 50/40* | (2016.01) | |
| *H02J 50/90* | (2016.01) | |
| *H01F 38/14* | (2006.01) | |
| *H01F 27/02* | (2006.01) | |
| *B60L 3/00* | (2006.01) | |

(52) U.S. Cl.
CPC ............. *H01F 38/14* (2013.01); *H02J 50/12* (2016.02); *H02J 50/20* (2016.02); *H02J 50/40* (2016.02); *H02J 50/90* (2016.02); *B60L 3/00* (2013.01)

(58) Field of Classification Search
CPC ................... B60L 5/005; B60L 11/182; B60L 11/1829–11/1831; Y02T 90/122; H01F 27/006; H01F 27/365; H01F 38/14; H01F 2038/143–2038/146; H01R 13/6633; A61B 1/00029; A61N 1/3787
USPC .......................................... 307/104; 320/108
See application file for complete search history.

(56) References Cited

U.S. PATENT DOCUMENTS

| | | |
|---|---|---|
| 2007/0064406 A1 | 3/2007 | Beart |
| 2008/0278264 A1 | 11/2008 | Karalis et al. |
| 2009/0121677 A1 | 5/2009 | Inoue et al. |
| 2010/0065352 A1* | 3/2010 | Ichikawa .............. B60L 11/182 180/65.8 |
| 2011/0037322 A1 | 2/2011 | Kanno |
| 2011/0148351 A1 | 6/2011 | Ichikawa |
| 2014/0001880 A1 | 1/2014 | Herglotz |
| 2014/0029233 A1 | 1/2014 | Yanagida |
| 2014/0035389 A1 | 2/2014 | Ngahu |
| 2014/0042823 A1 | 2/2014 | Nakahara |
| 2014/0232331 A1* | 8/2014 | Stamenic .............. B60L 11/182 320/108 |
| 2014/0295703 A1 | 10/2014 | Nagashima |
| 2015/0008877 A1 | 1/2015 | Ichikawa |

FOREIGN PATENT DOCUMENTS

| | | |
|---|---|---|
| JP | 08-205432 A | 8/1996 |
| JP | 2010-070048 A | 4/2010 |
| JP | 2010-087353 A | 4/2010 |
| JP | 2011-041464 A | 2/2011 |
| JP | 2011-072188 A | 4/2011 |
| JP | 2012-084893 A | 4/2012 |
| JP | 2012-119615 A | 6/2012 |
| WO | WO 2010/122598 A1 | 10/2010 |

OTHER PUBLICATIONS

PCT/ISA/237 for corresponding International Application No. PCT/JP2013/004133 dated Jul. 23, 2013 and partial English translation.
International Preliminary Report on Patentability for corresponding International Application No. PCT/JP2013/004133, dated Jan. 7, 2014.

* cited by examiner

WIRELESS POWER TRANSMISSION SYSTEM, POWER TRANSMITTING DEVICE, AND POWER RECEIVING DEVICE

This application is a continuation of U.S. patent application Ser. No. 13/935,544 filed on Jul. 4, 2013, which claims priority under 35 USC § 119(e) to U.S. Provisional Application No. 61/668,198 filed on Jul. 5, 2012, the entire contents of which are incorporated herein by reference.

BACKGROUND

1. Technical Field

The present disclosure relates to a resonant magnetic coupling type non-contact power transmission technology for transmitting power wirelessly by using resonant magnetic coupling.

2. Description of the Related Art

United States Patent Application Publication No. 2008/0278264 (FIGS. 10 and 12) discloses a new type of wireless power transmission system for transmitting power through a space from one of two resonators to the other, and vice versa. That wireless power transmission system couples those two resonators with each other via the evanescent tail of the oscillation energy of the resonant frequency that is produced in the space surrounding those two resonators, thereby transferring the oscillation energy wirelessly (i.e., by a non-contact method).

Japanese Laid-Open Patent Publication No. 2011-41464 discloses another resonant magnetic coupling type wireless power transmission system. Such a wireless power transmission system can raise the voltage effectively in transmitting electric power with relatively low coupling efficiency.

SUMMARY

There is concern that when electric power is transmitted via resonant magnetic coupling, the resonant magnetic field might leak out of the system and could do harm on surrounding persons. An embodiment of the present invention provides a wireless power transmission system and power transmitting device that can minimize such a leaking magnetic field.

A wireless power transmission system according to an embodiment includes: a power transmitting antenna and a power receiving antenna that are arranged so as to face each other and not to be in contact with each other; and an electromagnetic shield structure that houses, in its inner space, the power transmitting and power receiving antennas that face each other and that includes a first shield and a second shield. The first shield includes a first flat plate portion that faces the power transmitting antenna and a first shield sidewall that is extended from the edge of the first flat plate portion perpendicularly to the first flat plate portion so as to define a first space to house the power transmitting antenna. The second shield includes a second flat plate portion that faces the power receiving antenna and a second shield sidewall that is extended from the edge of the second flat plate portion perpendicularly to the second flat plate portion so as to define a second space to house the power receiving antenna. At least one of the first and second shields includes a protruding portion that is parallel to at least one of the power transmitting and power receiving antennas and that protrudes out of the electromagnetic shield structure from at least one of the first and second shield sidewalls. Power is transmitted by a non-contact method through a radio frequency magnetic field from the power transmitting antenna to the power receiving antenna.

A wireless power transmission system and power transmitting device according to an embodiment of the present invention can minimize the leaking magnetic field by using magnetic components.

This general and particular aspect can be implemented as a system, a method, a computer program or a combination thereof.

Other benefits and advantages of an embodiment disclosed herein will become apparent from the following description and attached drawings. Those benefits and/or advantages can be provided individually by the matter that is disclosed in the description and drawings. It should be noted, however, that not everything needs to be provided to achieve one or two or more similar ones of those benefits and advantages.

DETAILED DESCRIPTION

Figure 1:
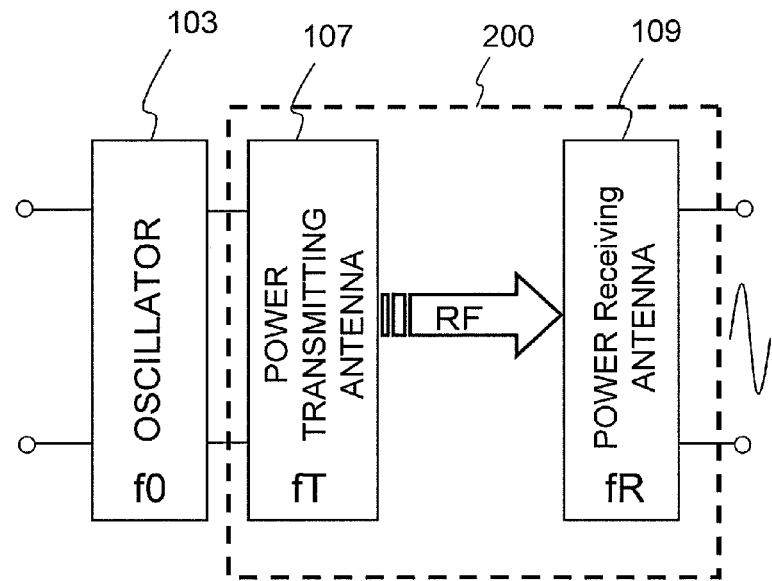
FIG. 1 illustrates an exemplary basic configuration for a wireless power transmission system according to the present disclosure.

Before embodiments of a wireless power transmission system according to the present disclosure are described, the basic configuration of the present disclosure will be described briefly.

According to an aspect of the present disclosure, a wireless power transmission system includes a first inductor and a second inductor, between that power is transmitted by a non-contact method via resonant magnetic coupling. The second inductor is spaced apart from the first inductor. One of the first and second inductors functions as an inductor for a power transmitting antenna and the other functions as an inductor for a power receiving antenna.

In one embodiment, this wireless power transmission system includes an electromagnetic shield structure that houses, in its inner space, the power transmitting and power receiving antennas that are arranged to face each other. The electromagnetic shield structure includes a first shield and a second shield. The first shield includes a first flat plate portion that faces the power transmitting antenna and a first shield sidewall that is extended from the edge of the first flat plate portion perpendicularly to the first flat plate portion so as to define a first space to house the power transmitting antenna. The second shield includes a second flat plate portion that faces the power receiving antenna and a second shield sidewall that is extended from the edge of the second flat plate portion perpendicularly to the second flat plate portion so as to define a second space to house the power receiving antenna. At least one of the first and second shields includes a protruding portion (additional shield) that is parallel to at least one of the power transmitting and power receiving antennas and that protrudes out of the electromagnetic shield structure from at least one of the first and second shield sidewalls. When the power transmitting and power receiving antennas are arranged to face each other, a gap is formed between the first and second shields. By adopting such a configuration, the strength of the magnetic field leaking out through that gap can be reduced.

In one embodiment, the protruding portion protrudes out of the electromagnetic shield structure as a brim from a portion of the first shield that defines one end of the gap.

In one embodiment, the protruding portion protrudes out of the electromagnetic shield structure as a brim from a portion of the second shield that defines one end of the gap.

In one embodiment, each of the first and second shields has the protruding portion.

In one embodiment, the protruding portions protrude out of the electromagnetic shield structure as brims from portions that define one and the other ends of the gap.

In one embodiment, the protruding portion is parallel to the boundary plane.

In one embodiment, the wireless power transmission system includes a housing with a conductor portion. The conductor portion of the housing is in contact with the protruding portion of the electromagnetic shield structure.

In one embodiment, the electromagnetic shield structure is made of a non-magnetic conductive material.

In one embodiment, at least one of the first and second shields includes a magnetic material sheet that faces either the power receiving antenna or the power transmitting antenna.

In one embodiment, the protruding portion is coupled electromagnetically to the first shield or the second shield at the frequency of the radio frequency magnetic field.

In one embodiment, the first shield has the protruding portion and if the distance from the power transmitting antenna to a surface of the first shield that faces the antenna is G1 and the length of the protruding portion of the first shield is EL, then $0.1 \leq EL/G1$ is satisfied.

In one embodiment, the second shield has the protruding portion and if the distance from the power receiving antenna to a surface of the second shield that faces the antenna is G2 and the length of the protruding portion of the second shield is EL, then $0.1 \leq EL/G2$ is satisfied.

Now take a look at FIG. 1, which illustrates an exemplary basic configuration for a wireless power transmission system according to the present disclosure. This exemplary wireless power transmission system includes an oscillator 103 with an oscillation frequency f0, a power transmitting antenna 107 with a resonant frequency fT, a power receiving antenna 109 with a resonant frequency fR, and an electromagnetic shield structure 200. The resonant frequencies fT and fR are typically set to be equal to the frequency f0. However, these resonant frequencies fT, fR and f0 are not necessarily set to be equal to each other. The frequency f0 may be in the range of 50 Hz to 300 GHz. Specifically, the frequency f0 may fall within the range of 100 kHz to 10 GHz in one example and is typically set to be in the range of 500 kHz to 20 MHz. However, depending on the application, the frequency f0 may also be in the range of 10 kHz to 1 GHz, or 20 kHz to 20 MHz, 100 kHz to 205 kHz or 20 kHz to 100 kHz. In this description, the electric power to be transmitted via an oscillating magnetic field with such a frequency f0 will be sometimes referred to herein as "high frequency power" or "RF power". It should be noted that at least one of the oscillation frequency f0 of the oscillator 103 and the resonant frequencies fT and fR of the power transmitting and power receiving antennas 107 and 109 could be variable.

The oscillator 103 typically receives DC power and converts the DC power into RF power with the frequency f0 (i.e., performs DC-RF conversion). As the oscillator 103, a class D, E or F amplifier that would realize a high efficiency and low distortion characteristic may be used. Or a Doherty amplifier could also be used. Optionally, a sinusoidal wave may be produced with high efficiency by arranging a low-pass filter, a band-pass filter or a band-elimination filter after a switching element that generates an output signal with a distortion component. Alternatively, the oscillator 103 may also receive AC power and convert it into RF power.

The RF power output from the oscillator 103 is supplied to the power transmitting antenna 107 which is connected to the oscillator 103. The power transmitting antenna 107 and the power receiving antenna 109 are coupled together via a resonant magnetic field that is produced by their resonators, and the power receiving antenna 109 can receive the RF power that has been transmitted by the power transmitting antenna 107. The power receiving antenna 109 is not in contact with the power transmitting antenna 107 but is located at a distance of about 10 cm to about several meters from the power transmitting antenna 107, for example.

In the wireless electric power transmission system according to the present disclosure, the "antenna" is an element for transmitting electric power from one of two objects to the other, and vice versa, by using a coupling phenomenon that has been produced by the evanescent tail of the magnetic field of the resonator. According to such a wireless power transmission technique that uses the resonant magnetic coupling, power loss, which would otherwise be caused when an electromagnetic wave is transferred to a distant location, will not be caused, and therefore, the electric power can be transmitted with very high efficiency. Such a power transmission technique that uses the resonant magnetic coupling phenomenon will cause much less loss than a known non-contact electric power transmission that uses the Faraday's law of electromagnetic induction.

Figure 2:
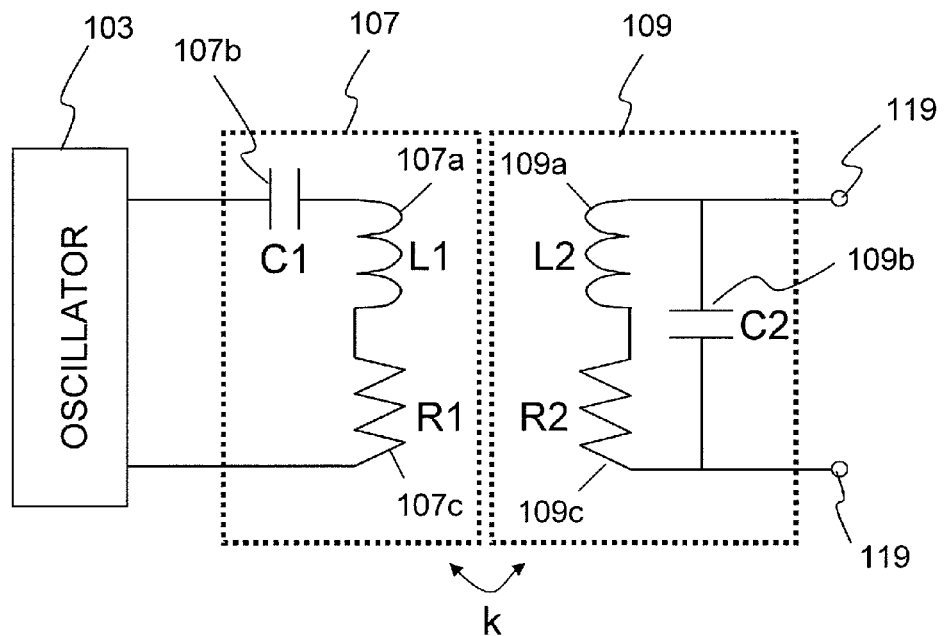
FIG. 2 illustrates an exemplary equivalent circuit for a pair of antennas for use in a wireless power transmission system according to the present disclosure.

Next, look at FIG. 2, which illustrates an exemplary equivalent circuit of the power transmitting and power receiving antennas 107 and 109. As shown in FIG. 2, the power transmitting antenna 107 according to the present disclosure is a series resonant circuit in which a first inductor 107a and a first capacitor 107b are connected together in series, while the power receiving antenna 109 is a parallel resonant circuit in which a second inductor 109a and a second capacitor 109b are connected together in parallel. The series resonant circuit of the power transmitting antenna 107 has a parasitic resistance component R1 and the parallel resonant circuit of the power receiving antenna 109 has a parasitic resistance component R2. In an alternative embodiment, the power transmitting antenna may be implemented as a parallel resonant circuit and the power receiving antenna may be implemented as a series resonant circuit.

Figure 3:
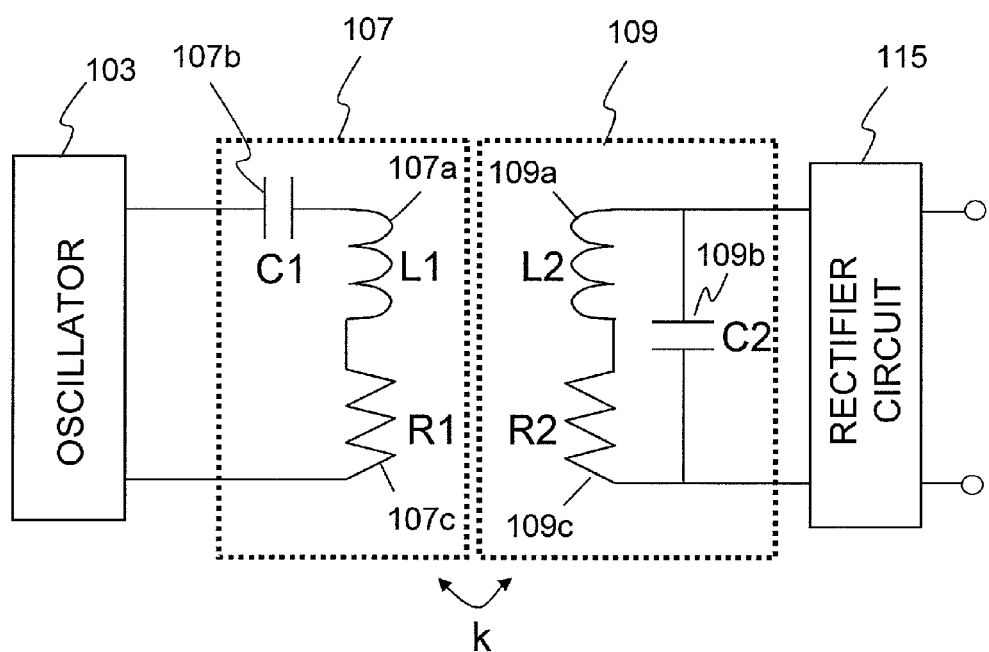
FIG. 3 illustrates an exemplary basic configuration for another wireless power transmission system (with a rectifier circuit) according to the present disclosure.

FIG. 3 illustrates another wireless power transmission system according to the present disclosure. Unlike the wireless power transmission system shown in FIG. 2, this wireless power transmission system includes a rectifier circuit (rectifier) 115 which is connected to the power receiving antenna 109. Thanks to the action of this rectifier circuit 115, the wireless power transmission system can output DC power.

In the wireless power transmission system of the present disclosure, an electromagnetic shield structure 200 is arranged to surround the power transmitting antenna 107 and the power receiving antenna 109 as shown in FIG. 1, thereby suppressing the leaking magnetic field. The configuration and function of the electromagnetic shield structure 200 will be described in detail later with respect to embodiments and examples of the present disclosure.

In the wireless power transmission system described above, its section including the oscillator 103 and the power transmitting antenna 107 functions as a power transmitting device. Optionally, a plurality of devices, each including the power receiving antenna 109, may be allocated to a single power transmitting device. In other words, a plurality of devices or vehicles, each including the power receiving antenna 109, may be sequentially arranged so as to face the power transmitting antenna 107 and electric power may be transmitted wirelessly to one of those devices or vehicles after another.

EMBODIMENTS

Hereinafter, embodiments of a wireless power transmission system according to the present invention will be described with reference to the accompanying drawings.

Figure 4:
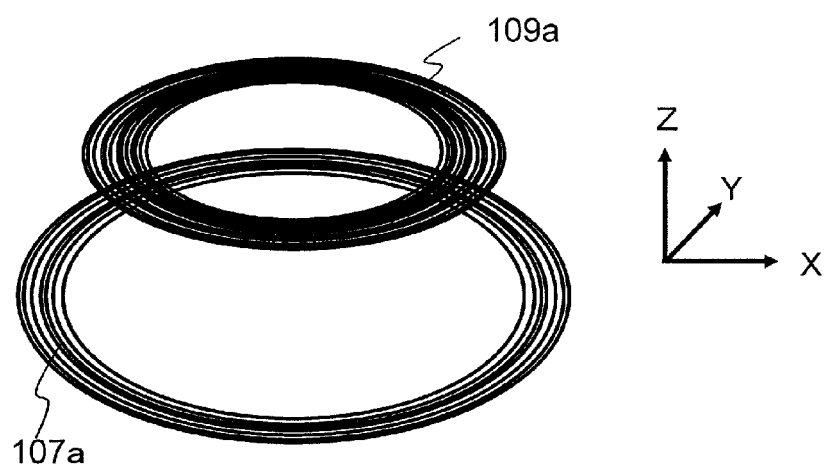
FIG. 4 is a perspective view schematically illustrating an exemplary arrangement of antennas in a wireless power transmission system according to the present disclosure.
Figure 5:
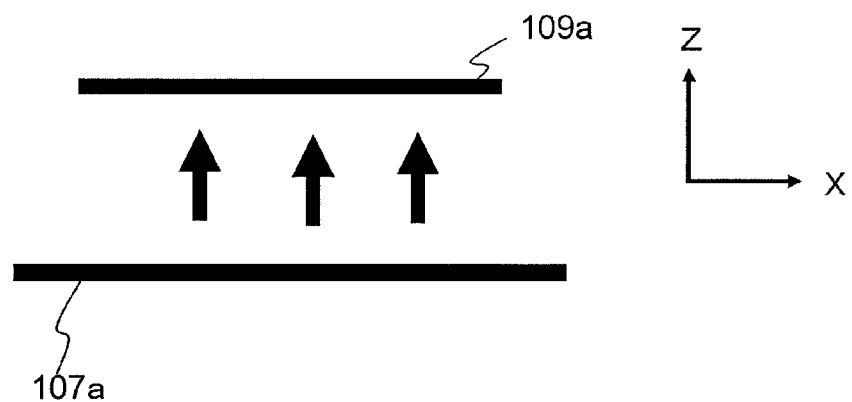
FIG. 5 is a side view schematically illustrating an exemplary arrangement of antennas in a wireless power transmission system according to the present disclosure.

First of all, look at FIGS. 4 and 5, which are respectively is a perspective view and a side view schematically illustrating the arrangement of antennas in a wireless power transmission system according to an embodiment. In FIGS. 4 and 5, of those components of the wireless power transmission system of the present disclosure described above, only the first and second inductors 107a and 109a are shown for the sake of simplicity. The first and second inductors 107a and 109a are actually connected to the circuit elements shown in FIG. 2 through cables (not shown). In the following description, the first and second inductors 107a and 109a will be sometimes referred to herein as the power transmitting antenna 107 and the power receiving antenna 109, respectively, for the sake of simplicity.

As shown in FIG. 4, each of the first and second inductors 107a and 109a of this embodiment is implemented as a coil that has been wound to have a center hole. The second inductor 109a is spaced apart from the first inductor 107a. On the drawings, the interval between the first and second inductors 107a and 109a is not to scale and different from the actual one. Even though the second inductor 109a is smaller than the first inductor 107a in the example illustrated in FIG. 4, this is only an example and the first and second inductors 107a and 109a may have any other size relation.

In an embodiment, both of the first and second inductors 107a and 109a may be arranged so as to extend on two different planes and face each other in parallel. The profile of the inductors 107a and 109a that function as respective antennas does not have to be a circular one but may also be an elliptical, polygonal or any other arbitrary shape. In the example illustrated in FIGS. 4 and 5, both of the inductors 107a and 109a have axisymmetric shapes. However, one or both of the inductors 107a and 109a may also have a shape with a low degree of symmetry (such as an elliptical shape, a rectangular shape or a band shape). In one embodiment, when the first inductor 107a is viewed in the Z direction, the size of the first inductor 107a may be set to be greater when measured in a first direction than when measured perpendicularly to the first direction.

The first and second inductors 107a and 109a do not have to be arranged at fixed positions. Alternatively, a power transmitting device including the first inductor 107a and a power receiving device including the second inductor 109a may also be configured to move independently of each other or may even be configured so that one of them is fixed and only the other is movable. Still alternatively, a single power transmitting device including the first inductor 107a may be fixed and any of a plurality of power receiving devices, each including the second inductor 109a, may be arranged to face the power transmitting device when power needs to be transmitted wirelessly.

In this embodiment, the first and second inductors 107a and 109a have a spiral structure, of which the numbers of turns are N1 and N2, respectively, where N1>1 and N2>1. However, the first and second inductors 107a and 109a may also have a loop structure with a number of turns of one. These inductors 107a and 109a do not have to be made of a single-layer conductor pattern but may also be a series connection of multiple conductor patterns that have been stacked one upon the other.

The first and second inductors 107a and 109a are suitably made of copper, silver or any other conductor with good electrical conductivity. As RF current with RF power flows mostly around the surface of a conductor, the surface of the conductor may be covered with a material with high electrical conductivity to increase the power generation efficiency. If the inductors 107a and 109a are designed so as to have a cavity in the middle of its cross section, their weight can be reduced. Furthermore, if the inductors 107a and 109a are formed by adopting a parallel wiring structure with Litz wires, for example, then the conductor loss per unit length can be reduced and the Q factors of the series resonant circuit and the parallel resonant circuit can be increased. As a result, electric power can be transmitted with even higher efficiency.

As described above, electric power is transmitted from the first inductor 107a to the second inductor 109a, or vice versa, via resonant magnetic coupling. In an embodiment of the present invention, the second inductor 109a may be built in an electric car and the first inductor 107a may be embedded in a road. In that case, as the electric car can move, the position of the second inductor 109a with respect to the first inductor 107a may also change. Nevertheless, power can be transmitted wirelessly when the first and second inductors 107a and 109a are facing each other.

The second inductor 109a built in an electric car may have a size that is small enough to be fitted in a rectangular area with a size of 20 to 30 cm one side. In that case, the hole 110 of the first inductor 107a may have a width (which is a size as measured perpendicularly to the electric car's traveling direction) of 30 to 300 cm. When used for charging the car running, the first inductor 107a may have a structure that is stretched in the vehicle's running direction. When such a structure is adopted, the respective sizes of the first and second inductors 107a and 109a as measured in the vehicle's running direction can be called the "lengths" of the inductors, while their sizes as measured perpendicularly to the vehicle's running direction can be called the "widths" of the inductors. The width of the first inductor 107a may be set to fall within the range of 30 to 300 cm and that of the second inductor 109a may be set to fall within the range of 20 to 30 cm.

Figure 6A:
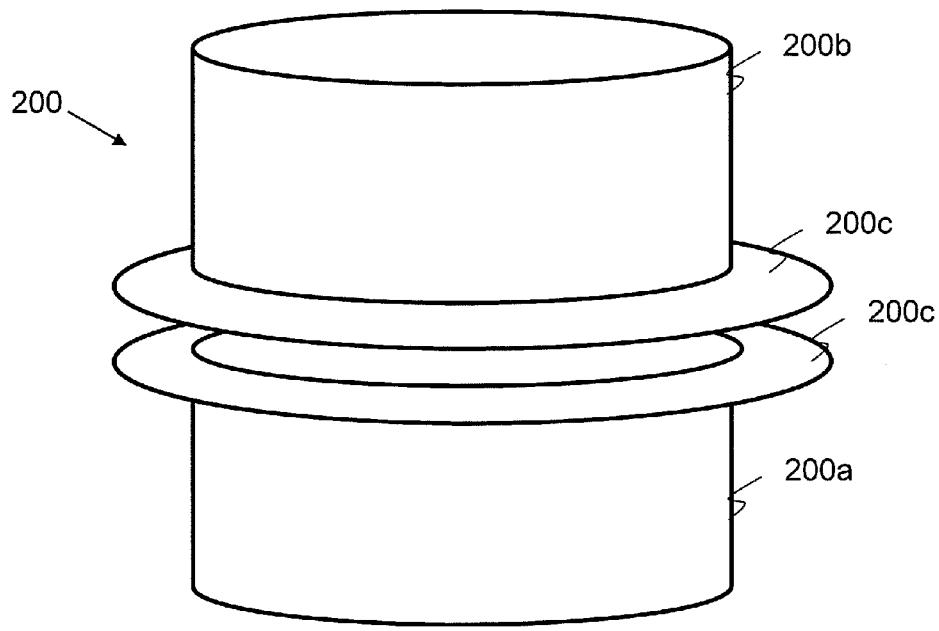
FIG. 6A is a perspective view illustrating an exemplary electromagnetic shield structure for a wireless power transmission system according to the present disclosure.
Figure 6B:
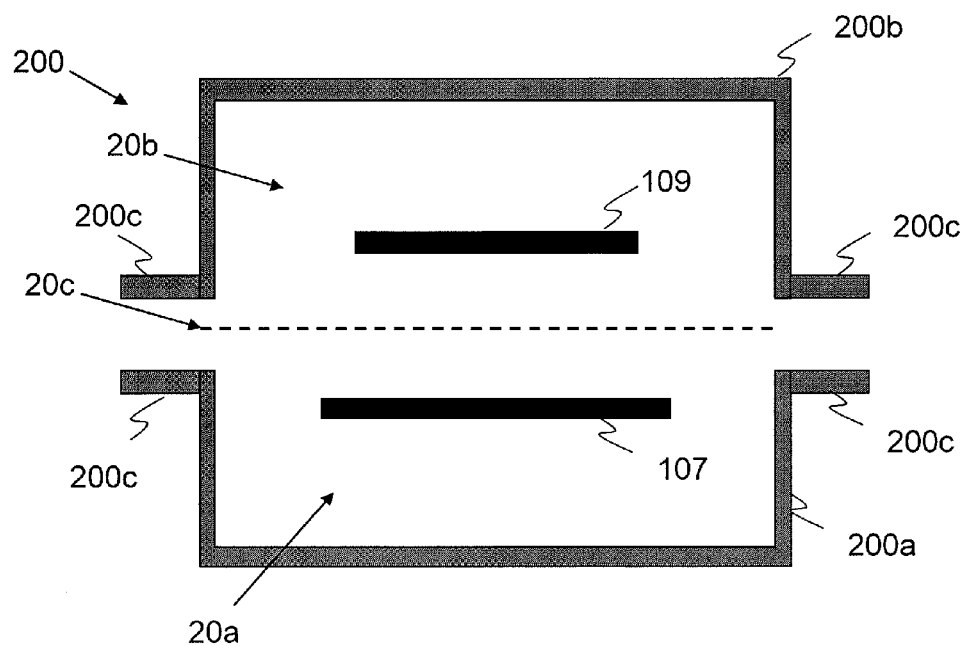
FIG. 6B is a cross-sectional view illustrating an exemplary electromagnetic shield structure for a wireless power transmission system according to the present disclosure.

To reduce the leakage of a magnetic field while power is being transmitted, this wireless power transmission system includes the electromagnetic shield structure 200. FIG. 6A is a perspective view illustrating an electromagnetic shield structure 200 according to an embodiment, and FIG. 6B is a schematic cross-sectional view of the electromagnetic shield structure 200.

In an embodiment, the electromagnetic shield structure 200 has such an overall shape as to surround the power transmitting antenna 107 and the power receiving antenna 109 that are arranged to face each other. More specifically, the electromagnetic shield structure 200 includes first and second shields 200a and 200b which house, in its inner space, the power transmitting antenna 107 and the power receiving antenna 109, respectively. The first shield 200a is configured to define a first space 20a to house the power transmitting antenna 107. On the other hand, the second shield 200b is configured to define a second space 20b to house the power receiving antenna 109. More specifically, in the example illustrated in FIGS. 6A and 6B, each of these shields 200a and 200b is comprised of a flat plate portion (which is either the ceiling or the bottom plate) which faces its associated antenna and a shield sidewall which is extended perpendicularly from the flat plate portion. In this description, if the "shield sidewall is extended perpendicularly from the flat plate portion", the shield sidewall may naturally cross the flat plate portion exactly at right angles but could also define an angle which is different from 90 degrees to the point that the effect of reducing the leaking magnetic field can be achieved. The range of that angle in which the leaking magnetic field can be reduced effectively is suitably within ±30 degrees from the right angles (90 degrees) with respect to the flat plate portion, and more suitably within ±10 degrees from 90 degrees. Each of the first and second shields 200a and 200b may be a plate member which has a thickness of approximately 0.1 mm to approximately 10 cm and which is made of a non-magnetic conductive material such as copper, aluminum, gold, silver or platinum. Optionally, the first and second shields 200a and 200b may be made of mutually different materials and have respectively different shapes. If necessary, the surface of the shields 200a and 200b may be coated either partially or entirely with a film or layer of a different material from the shields' own material. Such a film or layer may be made of a material having a higher conductivity than the shields' own material. If the surface of the shields is coated with a conductive material, the shields themselves do not have to be made of a conductive material.

The first and second shields 200a and 200b are arranged so as to leave a gap between their ends while facing each other. The gap may have a size of 3 mm to 1 mm, for example. The wider this gap, the higher the strength of the magnetic field leaking out of the electromagnetic shield structure 200. That is why the first and second shields 200a and 200b are suitably designed so as to make the gap as narrow as possible. But the gap cannot be eliminated altogether. Also, as described above, in a situation where a power receiving device including the second inductor 109a is movable along with a device or vehicle in which the power receiving device is built with respect to a power transmitting device including the first inductor 107a, if misalignment occurs while the second shield 200b is being arranged to face the first shield 200a, the gap comes to have a non-zero value.

In an embodiment of the present invention, the wireless power transmission system includes a protruding portion 200c which is parallel to at least one of the power transmitting antenna 107 in the first shield 200a and the power receiving antenna 109 in the second shield 200b and which protrudes out of the electromagnetic shield structure 200 from the shield sidewall described above. In this description, if the protruding portion is "parallel to" at least one of the power transmitting and power receiving antennas, they may naturally be exactly parallel to each other but may also be non-parallel to each other to the point that the effect of reducing the leaking magnetic field can still be achieved. For example, these members may be non-parallel to each other within the range of ±10 degrees, more suitably within the range of ±5 degrees. In other words, such a protruding portion 200c protrudes outward along a boundary plane 20c between the first and second spaces 20a and 20b. The protruding portion 200c is also made of the non-magnetic conductive material described above. However, the material of the protruding portion 200c may or may not be the same as that of the first and/or second shield(s) 200a, 200b.

In the example illustrated in FIGS. 6A and 6B, the outer space in the vicinity of the gap left between the first and second shields 200a and 200b is interposed between the upper and lower protruding portions 200c. Between the protruding portions 200c and the shields 200a, 200b, electromagnetic coupling just needs to be realized within the frequency range of wireless power transmission. That is why there may be an insulating material layer or an air layer between the protruding portions 200c and the shields 200a, 200b. Typically, the protruding portions 200c is connected to the shields 200a, 200b either directly or with a conductive material interposed between them.

Figure 7A:
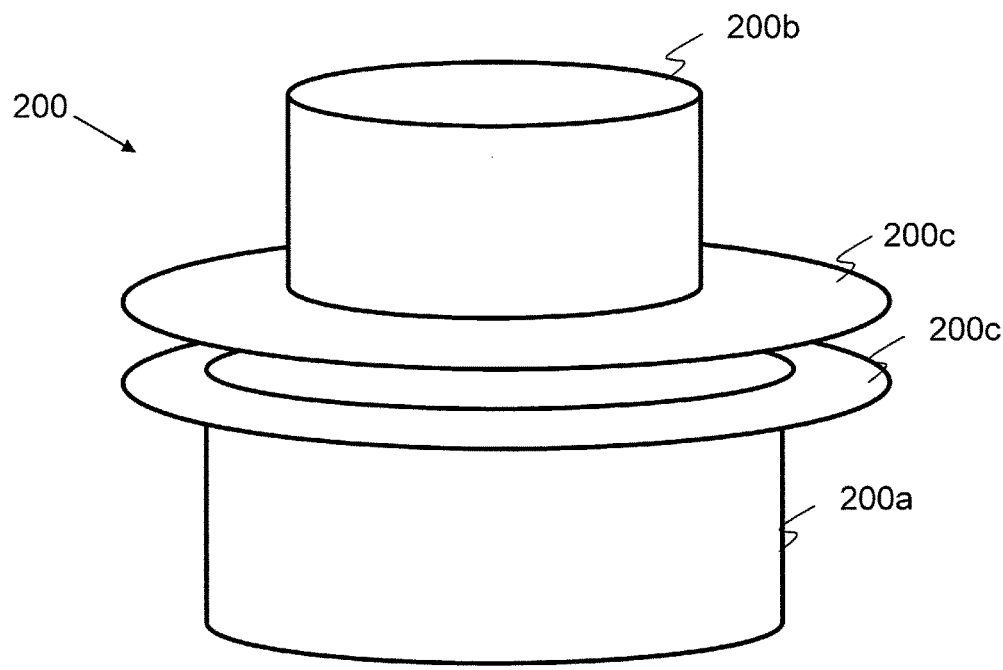
FIG. 7A is a perspective view illustrating another exemplary electromagnetic shield structure for a wireless power transmission system according to the present disclosure.
Figure 7B:
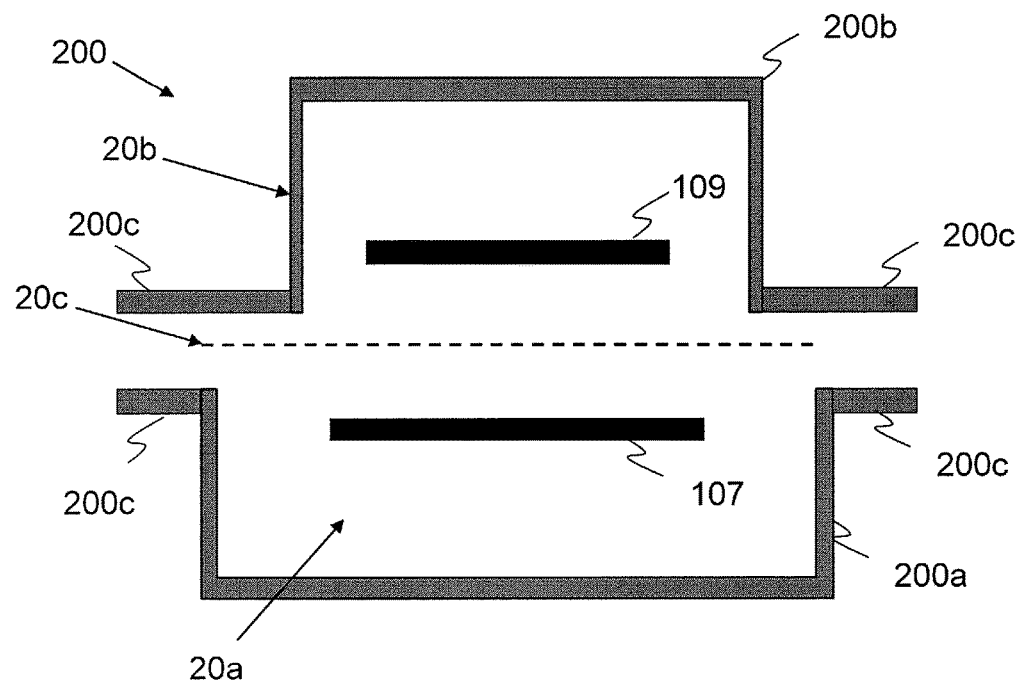
FIG. 7B is a cross-sectional view illustrating another exemplary electromagnetic shield structure for a wireless power transmission system according to the present disclosure.

FIGS. 7A and 7B illustrate another example of an electromagnetic shield structure 200. In this example, the size of the second shield 200b as measured parallel to the power receiving antenna 109 housed in the second shield 200b is smaller than that of the first shield 200a as measured parallel to the power receiving antenna 107 housed in the first shield 200a. In this example, the horizontal length (which may called the "width") of the protruding portion 200c provided for the second shield 200b is set to be larger than that of the protruding portion 200c provided for the first shield 200a so that the upper and lower protruding portions 200c face each other.

Figure 8A:
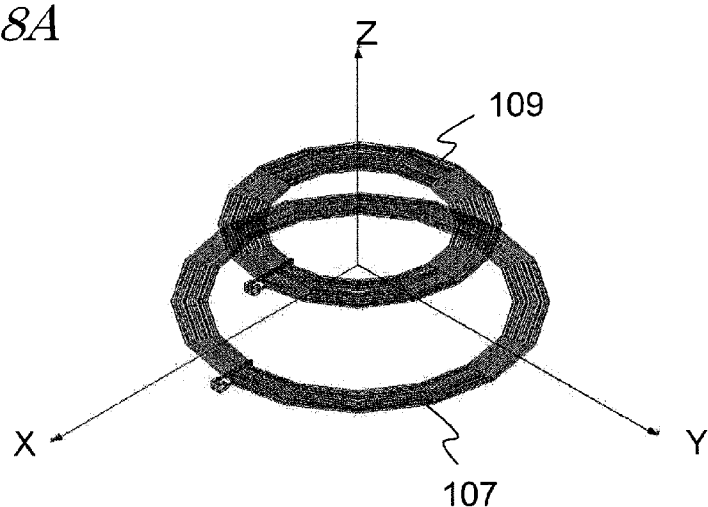
FIG. 8A is a perspective view illustrating an exemplary arrangement of antennas.
Figure 8B:
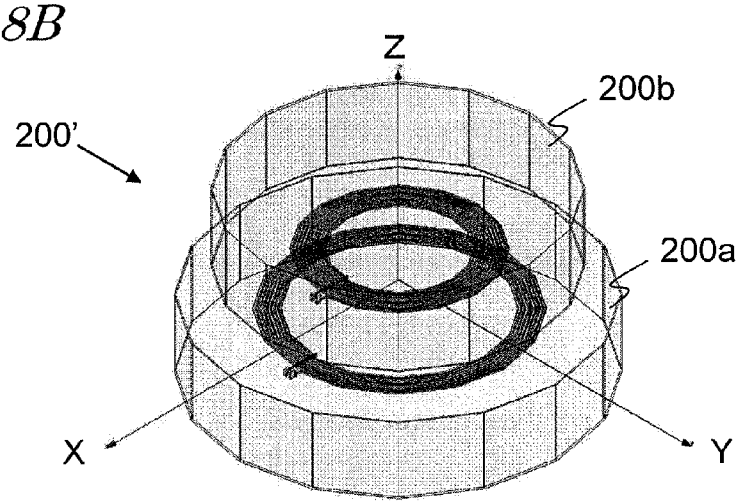
FIG. 8B is a see-through perspective view illustrating the relative arrangement of an electromagnetic shield structure with no protruding portions and antennas in a comparative example.
Figure 8C:
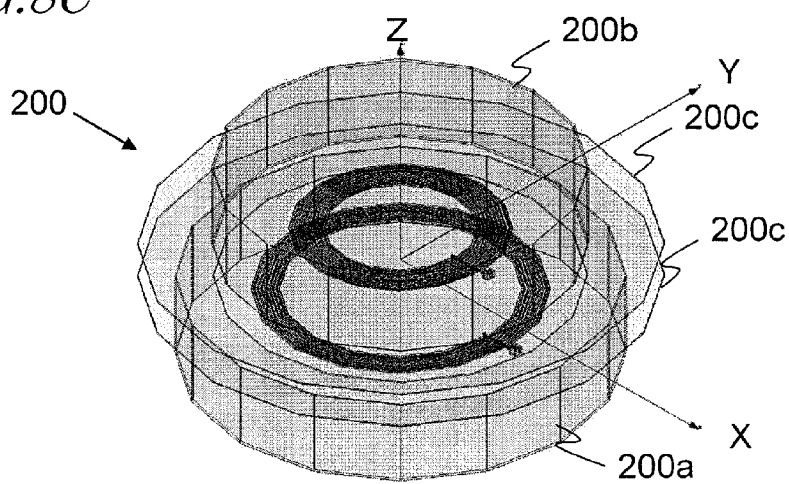
FIG. 8C is a see-through perspective view illustrating the relative arrangement of an electromagnetic shield structure with protruding portions and antennas in a specific example of the present disclosure.

FIGS. 8A, 8B and 8C are perspective views illustrating an exemplary arrangement of the antennas 107 and 109 that face each other, an electromagnetic shield structure 200' with no protruding portions 200c (representing a comparative example), and the electromagnetic shield structure 200 with the protruding portions 200c (representing an example of the present invention), respectively. The structures illustrated in these drawings have had their shapes simplified to carry out electromagnetic field simulations. That is why actually the electromagnetic shield structure 200 does not have to be made up of a plurality of flat plate portions as shown in FIG. 8C but may have a curved shape, too.

Figure 9:
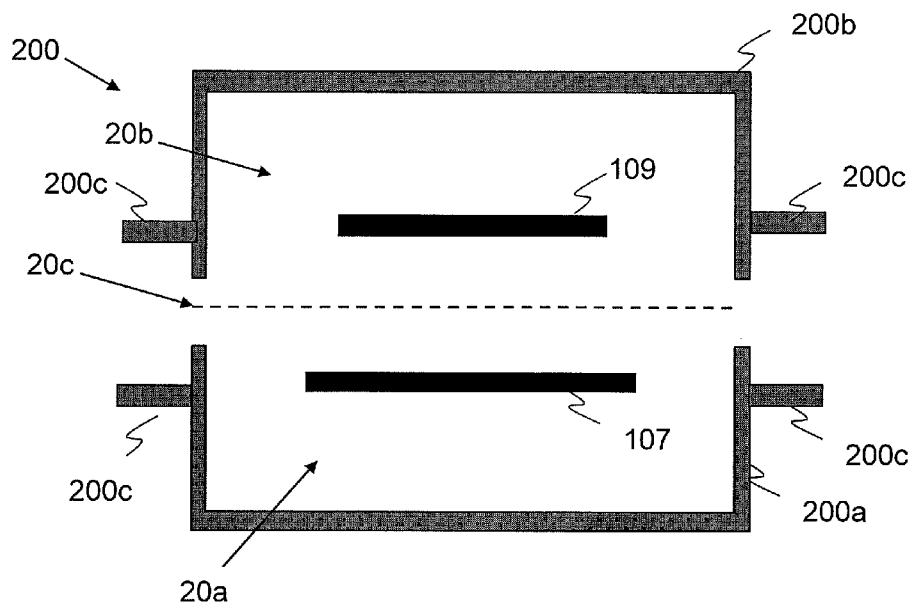
FIG. 9 is a cross-sectional view illustrating still another exemplary electromagnetic shield structure for a wireless power transmission system according to the present disclosure.
Figure 10:
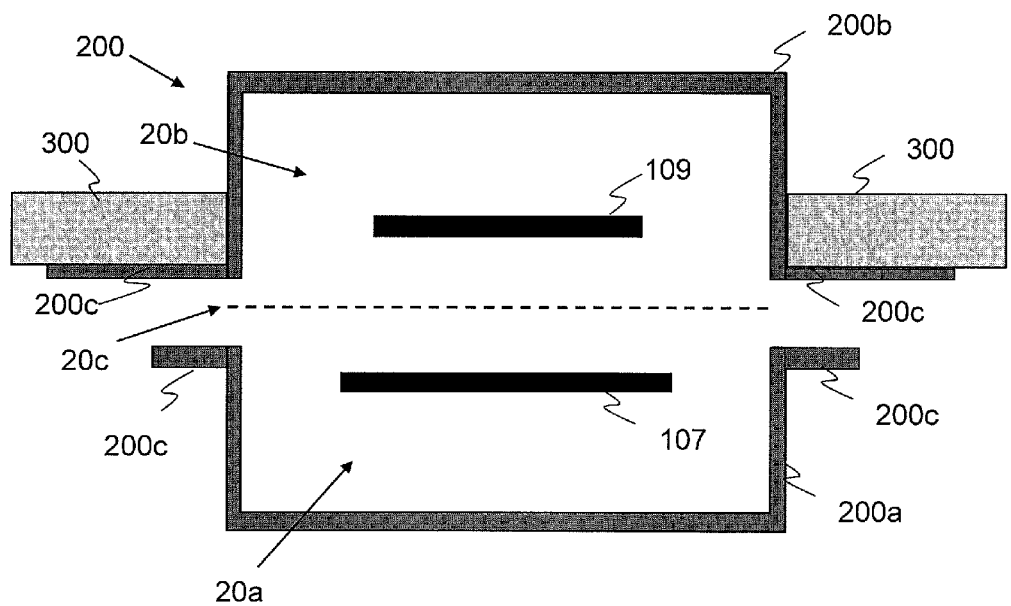
FIG. 10 is a cross-sectional view illustrating yet another exemplary electromagnetic shield structure for a wireless power transmission system according to the present disclosure.

The electromagnetic shield structure 200 of this embodiment does not have to have such a configuration. FIG. 9 illustrates an example in which the position to which the protruding portion 200c is attached has shifted from the edge portion of each of the first and second shields 200a and 200b. FIG. 10 illustrates an example in which the protruding portion 200c is in contact with the metallic housing 300 of the power receiving device.

Figure 11:
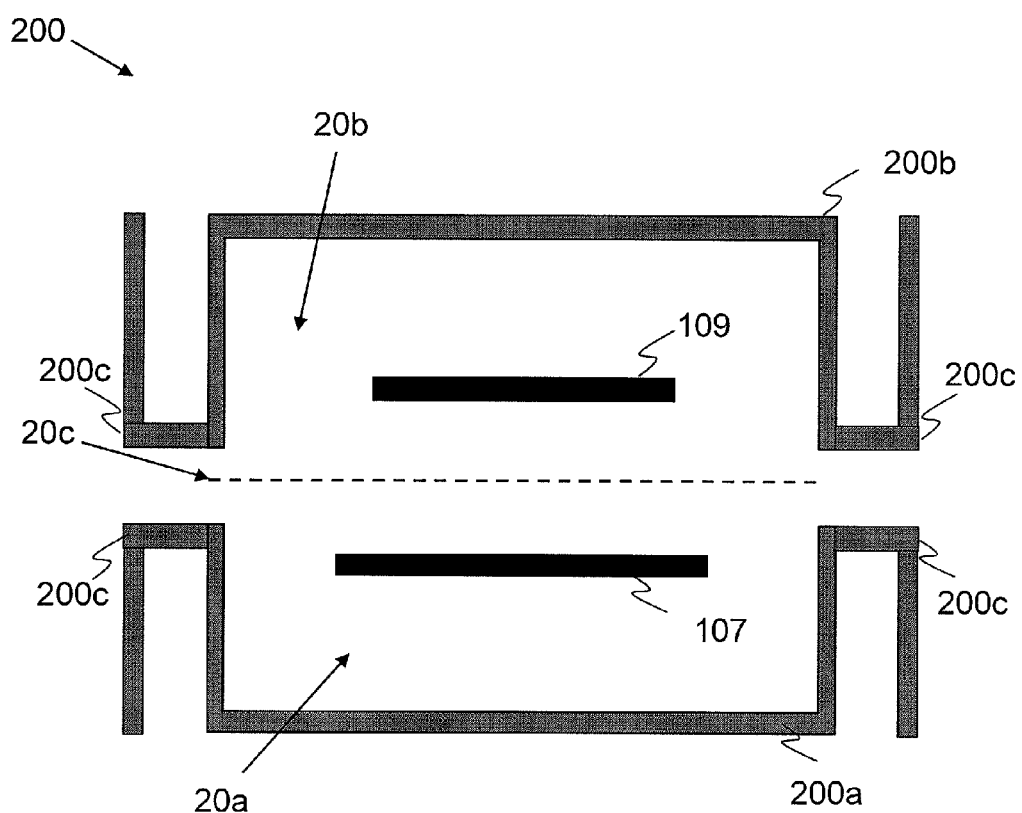
FIG. 11 is a cross-sectional view illustrating yet another exemplary electromagnetic shield structure for a wireless power transmission system according to the present disclosure.

FIG. 11 illustrates another modified example of the protruding portion 200c shown in FIG. 6B. The protruding portion 200c shown in FIG. 11 is bent upward halfway so that its outer part runs parallel to the shield sidewall and reaches the flat plate portion. Even the protruding portion 200c in such a shape can also reduce the leaking magnetic field no less effectively than in the example shown in FIG. 6B. The present inventors carried out various simulations to discover that the configuration including the protruding portion protruding out of the electromagnetic shield structure from the edge of the shield sidewall as shown in FIG. 6B was most effective in reducing the leaking magnetic field.

Figure 12:
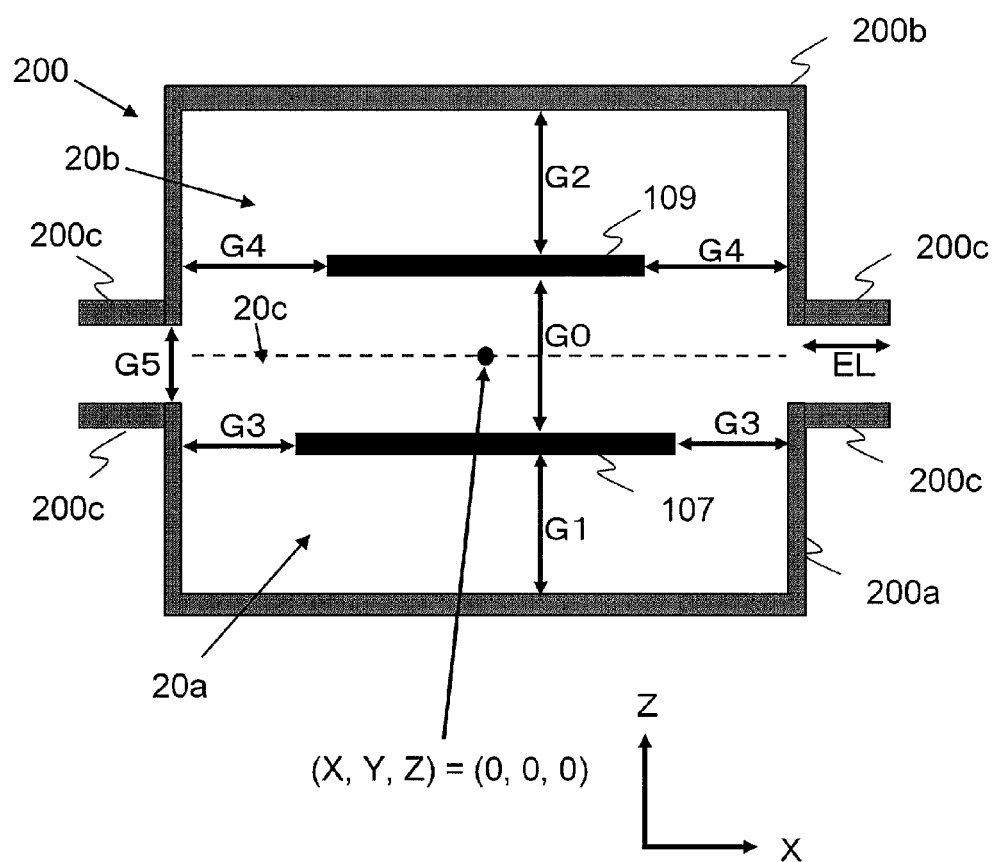
FIG. 12 is a cross-sectional view showing parameters that define the sizes of an electromagnetic shield structure for a wireless power transmission system according to the present disclosure.

Next, take a look at FIG. 12, which corresponds to the cross-sectional view shown in FIG. 6B and which indicates the sizes of the antennas 107, 109 and respective parts of the electromagnetic shield structure 200. The meanings of the respective reference signs shown in FIG. 12 are summarized in the following Table 1:

TABLE 1

| | |
|---|---|
| G0 | Distance between antennas |
| G1 | Distance from the power transmitting antenna 107 to a surface of the first shield 200a that faces the antenna |
| G2 | Distance from the power receiving antenna 109 to a surface of the second shield 200b that faces the antenna |
| G3 | Distance from the power transmitting antenna 107 to the side surface of the first shield 200a |
| G4 | Distance from the power receiving antenna 109 to the side surface of the second shield 200b |
| G5 | Size of the gap between the first and second shields 200a and 200b |
| EL | Length of the protruding portion 200c |

It should be noted that if the antennas 107 and 109 and the electromagnetic shield structure 200 are not axisymmetric with respect to the Z axis, then the values of these distances G3 and G4 have certain widths. In that case, the strength of the leaking magnetic field also varies according to the angle (i.e., azimuth angle) around the Z axis.

According to this embodiment, EL can be set so as to satisfy $G1*0.1 \leq EL$ and $G2*0.1 \leq EL$.

To reduce multiple reflection of the RF power between the circuit blocks and to improve the overall power generation efficiency, when the output terminal of the power receiving antenna 109 is connected to a load, the output impedance Zoc of the RF power of the oscillator 103 may be matched to the input impedance Zic of the power transmitting antenna 107. Likewise, when the oscillator 103 is connected to the power transmitting antenna 107, the output impedance Zout of the power receiving antenna may be matched to the resistance value R of the connected load. In this description, if two impedances are "equal to each other", then the impedances may naturally be exactly equal to each other but could also be just roughly equal to each other. Specifically, if the difference between the greater and smaller impedances is within 25% of the greater one, then those two impedances will also be regarded herein as being "equal to each other".

Another magnetic material may be arranged around the first and/or second inductor(s) 107a, 109a. As the first and second capacitors 107b and 109b, any type of capacitors, which may have a chip shape, a lead shape or any other appropriate shape, may be used. Optionally, the capacitance produced between two levels of wires that interpose the air between them could also function as the first and second capacitors 107b and 109b. If the first and second capacitors 107b and 109b are implemented as MIM capacitors, a low-loss capacitor circuit can be formed by known semiconductor device processing or multilevel circuit board process.

In order to increase the long-term reliability, those parts that form the power transmitting and power receiving antennas 107 and 109 (such as their inductors and capacitors) may be housed in a protective housing. Alternatively, the first and second spaces 20a and 20b may also be molded with resin. In that case, a resin in which a magnetic material is dispersed may also function as a molding member. Also, the protective housing may also be subjected to waterproof treatment. Optionally, at least one of the first and second shields 200a and 200b may include a magnetic material sheet that faces either the power receiving antenna 107 or the power transmitting antenna 109.

To minimize the transmission loss, the power transmitting and power receiving antennas 107 and 109 may be arranged as close to each other as possible.

In the embodiment described above, each of the shields 200a and 200b includes a flat plate portion which faces its associated antenna and a shield sidewall which is extended perpendicularly from the flat plate portion. However, this is just an example and such a structure does not always have to be adopted. Rather any other structure may be adopted as long as the first and second shields 200a and 200b are configured to make a first space to house the power transmitting antenna 107 and a second space to house the power receiving antenna 109, respectively. Also, the protruding portion 200c is supposed to be in the embodiment described above, but does not have to be, parallel to at least one of the power transmitting and power receiving antennas 107 and 109.

Example 1

As to a specific example having numerical parameters shown in the following Table 2, the distribution of the magnetic field strengths in the space was obtained by analyzing the electromagnetic field. A structure defined by those numerical parameters is as shown in FIG. 12. Meanwhile, as a comparative example, a system having the same configuration as that specific example, except that the protruding portion 200c was removed, was made and the distribution of leaking magnetic field strengths was obtained by simulations. In this specific example, the antennas 107 and 109 and the electromagnetic shield structure 200 are supposed to be axisymmetric with respect to the Z axis for the sake of simplicity:

TABLE 2

| | |
|---|---|
| G0 | 5.0 cm |
| G1 | 5.0 cm |
| G2 | 5.0 cm |
| G3 | 3.0 cm |
| G4 | 3.0 cm |
| G5 | 5 cm |
| EL | 3.0 cm |

In this example, each of the inductors 107a and 109a had a circular shape with a radius of 7.5 cm, the number of turns of 11, and a capacitance of 33000 pF. The power transmitted wirelessly was set to be 3 kW (at a transmission frequency of 150 kHz). The first and second shields 200a and 200b and the protruding portion 200c were made of a non-magnetic metal (such as aluminum or copper) with a thickness of 2 mm. The protruding portion 200c protruded outward as a brim in a plane intersecting with the Z-axis at right angles. Thus, in the following description, the protruding portion 200c will be sometimes referred to herein as a "brim".

Figure 13:
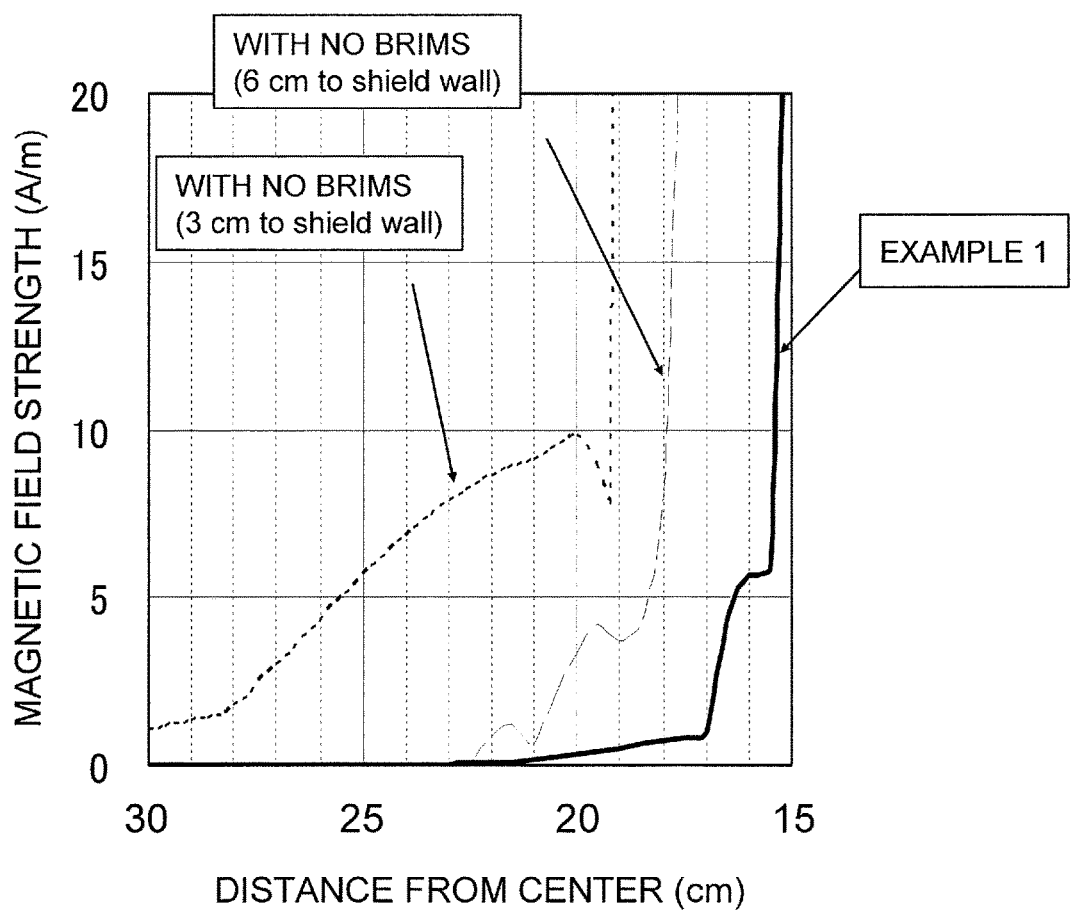
FIG. 13 is a graph showing how the leaking magnetic field strength changes with the distance from the center of the electromagnetic shield structure while power is being transmitted wirelessly.

FIG. 13 is a graph showing how the magnetic field strength changes with the distance from the center of the electromagnetic shield structure 200. The origin of the XYZ coordinate system is set at the "center" of the electromagnetic shield structure 200. That is to say, the "center" of the electromagnetic shield structure 200 is the point where (X, Y, Z)=(0, 0, 0). The magnetic field strength was calculated on an XY plane where Z=0. In FIG. 13, an example in which the shield wall was located at a distance of 6 cm (i.e., G3=G4=6 cm) will be referred to herein as Comparative Example #1 and an example in which the shield wall was located at a distance of 3 cm (i.e., G3=G4=3 cm) will be referred to herein as Comparative Example #2.

When an RF power of 3 kW was transmitted at a frequency of 150 kHz, the leaking magnetic field strength measured at a distance of 0.2 m from the center of the electromagnetic shield structure 200 was 10 A/m in Comparative Example #1 with no brims, 3.35 A/m in Comparative Example #2 with no brims, and 0.3 A/m in the specific example with brims, respectively. As can be seen, although there was concern about exposure to a magnetic field at a relatively high value in those comparative examples, the effect of reducing the magnetic field strength by 90 to 97% (i.e., a magnetic field suppression ratio of 11.2 to 33.3) was obtained in the specific example.

Example 2

Figure 14:
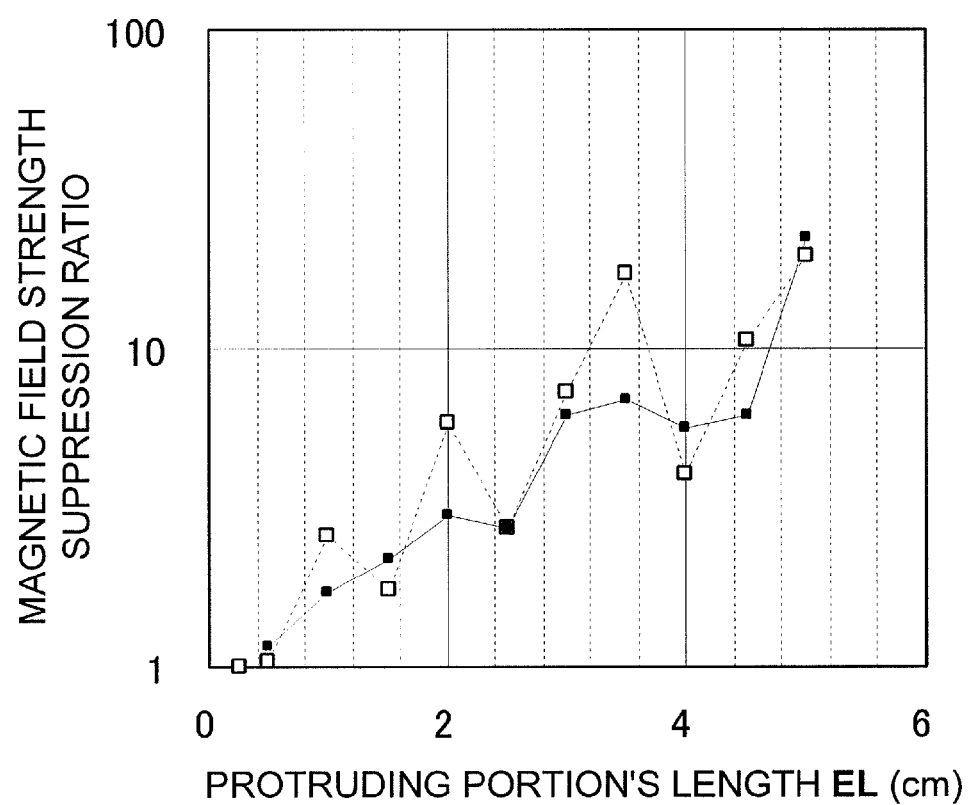
FIG. 14 is a graph showing how the magnetic field strength suppression ratio, that is the ratio of the magnetic field strength in a situation where the protruding portion 200c is provided to the leaking magnetic field strength in a situation where no protruding portion 200c is provided, changes with the length of the protruding portion 200c.

FIG. 14 is a graph showing how the leaking magnetic field strength changed with the length EL of the protruding portion 200c in Example 1 described above. In FIG. 14, the ordinate represents the ratio of magnetic field strength suppression to the value obtained when no protruding portions 200c were provided, and the abscissa represents the length EL of the protruding portion 200c introduced. In FIG. 14, shown is the magnetic field strength suppression ratio that was measured at a point where (X, Y, Z)=(7.5 cm+G3+EL, 0, 0). The size of the protruding portion 200c other than the length EL has its data indicated by the dotted line graph if its value is equal to the parameter value of the first example. On the other hand, the data of the parameter value in the first example that was obtained when G1=G2=0.5 cm is indicated by the solid line graph. In this specific example, the transmission power was set to be 200 W and the transmission frequency was set to be 750 kHz.

As can be seen from the graph shown in FIG. 14, when the length of the protruding portion 200c was EL and when the distance from an antenna to the surface of the shield facing that antenna was G1 or G2, the effect of reducing the leaking magnetic field could be achieved according to this embodiment by setting the length EL of the protruding portion 200c so as to satisfy either 0.1≤EL/G1 or 0.1≤EL/G2. Also, the longer the length EL of the protruding portion 200c is set to be, the more significantly the effect of reducing the leaking magnetic field can be achieved.

A wireless power transmission system according to the present disclosure can ensure the safety of a human user even when he or she may come rather close to it, and therefore, can be used effectively as not only a charger for transmitting power wirelessly to an electric car but also a cradle for supplying power to an audiovisual appliance mounted.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A wireless power transmission system comprising:
a power transmitting antenna and a power receiving antenna that are arranged so as to face each other and not to be in contact with each other; and
an electromagnetic shield structure that houses, in its inner space, the power transmitting and power receiving antennas that face each other and that includes a first shield and a second shield, the first shield including a first flat plate portion that faces the power transmitting antenna and a first shield sidewall that is extended from the edge of the first flat plate portion perpendicularly to the first flat plate portion so as to define a first space to house the power transmitting antenna, the second shield including a second flat plate portion that faces the power receiving antenna and a second shield sidewall that is extended from the edge of the second flat plate portion perpendicularly to the second flat plate portion so as to define a second space to house the power receiving antenna,
wherein the power transmitting and power receiving antennas each comprises a respective coil, and the coils of the antennas are extending on respective planes that face each other,
wherein the first and second shields include a first protruding portion and a second protruding portion, respectively, and the first and second protruding portions are parallel to at least one of the planes of the power transmitting and power receiving antennas and protrude out of the electromagnetic shield structure from the first and second shield sidewalls, respectively, wherein power is transmitted by a non-contact method through a radio frequency magnetic field from the power transmitting antenna to the power receiving antenna, wherein the first and second flat plate portions, the first and second sidewalls, and the first and second protruding portions are made of a non-magnetic conductive material, wherein the whole or a part of the first shield is covered by a first film or a first layer of a different material from the material of the first shield, and/or the whole or a part of the second shield is covered by a second film or a second layer of a different material from the material of the second shield, and wherein the distance from the power transmitting antenna to a surface of the first shield that faces the antenna is G1 and the length from the first sidewall to an edge of the first protruding portion is EL1, and $0.1 \le EL1/G1$ is satisfied, and wherein the distance from the power receiving antenna to a surface of the second shield that faces the antenna is G2 and the length from the second sidewall to an edge of the second protruding portion is EL2, and $0.1 \le EL2/G2$ is satisfied.

2. The wireless power transmission system of claim 1, wherein the first film or the first layer is made of a material having a higher conductivity than the material of the first shield, and/or the second film or the second layer is made of a material having a higher conductivity than the material of the second shield.

3. The wireless power transmission system of claim 1, wherein the first film or the first layer is made of a conductive material and the first shield is made of a nonconductive material, and/or the second film or the second layer is made of a conductive material and the second shield is made of a nonconductive material.

4. A wireless power transmitting device comprising:
a power transmitting antenna that are arranged so as to face a power receiving antenna and not to be in contact with the power receiving antenna; and
an electromagnetic shield structure that houses, in its inner space, the power transmitting antenna and that includes a first shield, the first shield including a first flat plate portion that faces the power transmitting antenna and a first shield sidewall that is extended from the edge of the first flat plate portion perpendicularly to the first flat plate portion so as to define a first space to house the power transmitting antenna,
wherein the power transmitting antenna comprises a coil extending on a plane that faces another plane on which a coil of the power receiving antenna are extending,
wherein the first shield includes a first protruding portion that is parallel to the plane of the power transmitting antenna and that protrudes out of the electromagnetic shield structure from the first shield sidewall,
wherein power is transmitted by a non-contact method through a radio frequency magnetic field from the power transmitting antenna to the power receiving antenna,
wherein the first flat plate portion, the first sidewall, and the first protruding portion are made of a non-magnetic conductive material,
wherein the whole or a part of the first shield is covered by a first film or a first layer of a different material from the material of the first shield, and
wherein the distance from the power transmitting antenna to a surface of the first shield that faces the antenna is G1 and the length from the first sidewall to an edge of the first protruding portion is EL1, and $0.1 \le EL1/G1$ is satisfied.

5. The wireless power transmitting device of claim 4, wherein the first film or the first layer is made of a material having a higher conductivity than the material of the first shield.

6. The wireless power transmitting device of claim 4, wherein the first film or the first layer is made of a conductive material and the first shield is made of a nonconductive material.

7. A wireless power receiving device comprising:
a power receiving antenna that is arranged so as to face a power transmitting antenna and not to be in contact with the power receiving antenna; and
an electromagnetic shield structure that houses, in its inner space, the power receiving antenna and that includes a second shield, the second shield including a second flat plate portion that faces the power receiving antenna and a second shield sidewall that is extended from the edge of the second flat plate portion perpendicularly to the second flat plate portion so as to define a second space to house the power receiving antenna,
wherein the power receiving antenna comprises a coil extending on a plane that faces another plane on which a coil of the power transmitting antenna are extending,
wherein the second shield includes a second protruding portion that is parallel to the plane of the power receiving antenna and that protrudes out of the electromagnetic shield structure from the second shield sidewall,
wherein power is transmitted by a non-contact method through a radio frequency magnetic field from the power transmitting antenna to the power receiving antenna,
wherein the second flat plate portion, the second sidewall, and the second protruding portion are made of a non-magnetic conductive material,
the whole or a part of the second shield is covered by a second film or a second layer of a different material from the material of the second shield, and
wherein the distance from the power receiving antenna to a surface of the second shield that faces the antenna is G2 and the length from the second sidewall to an edge of the second protruding portion is EL2, and $0.1 \le EL2/G2$ is satisfied.

8. The wireless power transmitting device of claim 7, wherein the second film or the second layer is made of a material having a higher conductivity than the material of the second shield.

9. The wireless power transmitting device of claim 7, wherein the second film or the second layer is made of a conductive material and the second shield is made of a nonconductive material.

* * * * *